United States Patent [19]

Pfeiffer et al.

[11] 4,417,203

[45] Nov. 22, 1983

[54] SYSTEM FOR CONTACTLESS ELECTRICAL PROPERTY TESTING OF MULTI-LAYER CERAMICS

[75] Inventors: Hans C. Pfeiffer, Ridgefield, Conn.; Robert A. Simpson, Wappingers Falls, N.Y.; Werner Stickel, Ridgefield, Conn.

[73] Assignee: International Business Machines Corporation, Armonk, N.Y.

[21] Appl. No.: 267,119

[22] Filed: May 26, 1981

[51] Int. Cl.³ ............................................. G01R 31/02
[52] U.S. Cl. .................................... 324/51; 324/71.3; 324/71.4; 324/158 R
[58] Field of Search .......... 324/52, 51, 158 R, 158 D, 324/73 PC, 71 EB; 250/305, 311, 492.1, 397

[56] References Cited

U.S. PATENT DOCUMENTS

| | | |
|---|---|---|
| 3,373,353 | 3/1968 | Harris . |
| 3,531,716 | 9/1970 | Tarui et al. . |
| 3,549,999 | 12/1970 | Norton . |
| 3,588,347 | 6/1971 | Monte et al. ................. 250/492.1 X |
| 3,588,347 | 6/1971 | Montone et al. ............. 250/492.1 X |
| 3,678,384 | 7/1972 | Oatley . |
| 3,763,425 | 10/1973 | Engelke . |
| 3,764,898 | 10/1973 | Bohlen et al. . |
| 3,796,947 | 3/1974 | Harrod et al. ....................... 324/51 |
| 3,882,532 | 5/1975 | Quinn . |
| 3,961,190 | 6/1976 | Lukianoff et al. . |
| 4,139,774 | 2/1979 | Katagiri . |
| 4,164,658 | 8/1979 | Frosien et al. . |
| 4,169,244 | 9/1979 | Plows . |
| 4,172,228 | 10/1979 | Frosch et al. . |
| 4,199,688 | 4/1980 | Ozasa . |
| 4,287,473 | 9/1981 | Sawyer ....................... 324/158 D X |

OTHER PUBLICATIONS

Elliot, Locating AC Faults in LSI Chips, IBM Tech. Discl. Bulletin, Sep. 1976, pp. 1485, 1486.
Rubloff, Contactless Testing by Commercial E-Beam Instruments, IBM Tech. Discl. Bull., Oct. 1980, p. 2150.
Chang, Electron Beam Addressable Liquid-Crystal Display with Storage Capability, IBM Tech. Discl. Bull., Jun. 1973, pp. 353, 354.
Posa, Electron Beam Finds, Memory Faults, Reconfigures Chips, Electronics, May 1981, pp. 37, 38.
Gill et al., Contactless Probing of Hyrid Substrates, International Journal for Hybrid Micro-Electronics, 1979, pp. 254 ff.
Morrissey, Scanning Electron Microscope Stage for Testing Integrated Circuits, IBM Tech. Discl. Bull., Dec. 1980, pp. 2803, 2804.
Kirkman, Integrity Testing, IBM Tech. Discl. Bull., Nov. 1976, p. 2225.
Lancaster, Dual Electron Beam Testing Probe, IBM Tech. Discl. Bull., Dec. 1969, p. 978.

Primary Examiner—Stanley T. Krawczewicz
Attorney, Agent, or Firm—Sughrue, Mion, Zinn, Macpeak, and Seas

[57] ABSTRACT

An electron beam system for non contact testing of three dimensional networks of conductors embedded in dielectric material, specifically detection of open and short circuit conditions. Top to bottom and top to top surface wiring is tested electrically without making physical electrical contact. The system comprises two flood beams and a focus probe beam wih one flood beam located at either side of the specimen. Proper choice of acceleration potentials, beam currents and dwell times of the beams allow alteration of the secondary electron emission from the specimen in such a way that electrical properties of the conductor networks can be measured directly. The difference in secondary electron emission resulting from different surface potentials is detected as a strong signal which allows clear discrimination between uninterrupted and interrupted as well as shorted pairs of conductors. This testing system can be applied to the high speed testing of advanced VLSI packaging substrates as well as to the greensheets, sublaminates, and laminates from which they are fabricated.

28 Claims, 5 Drawing Figures

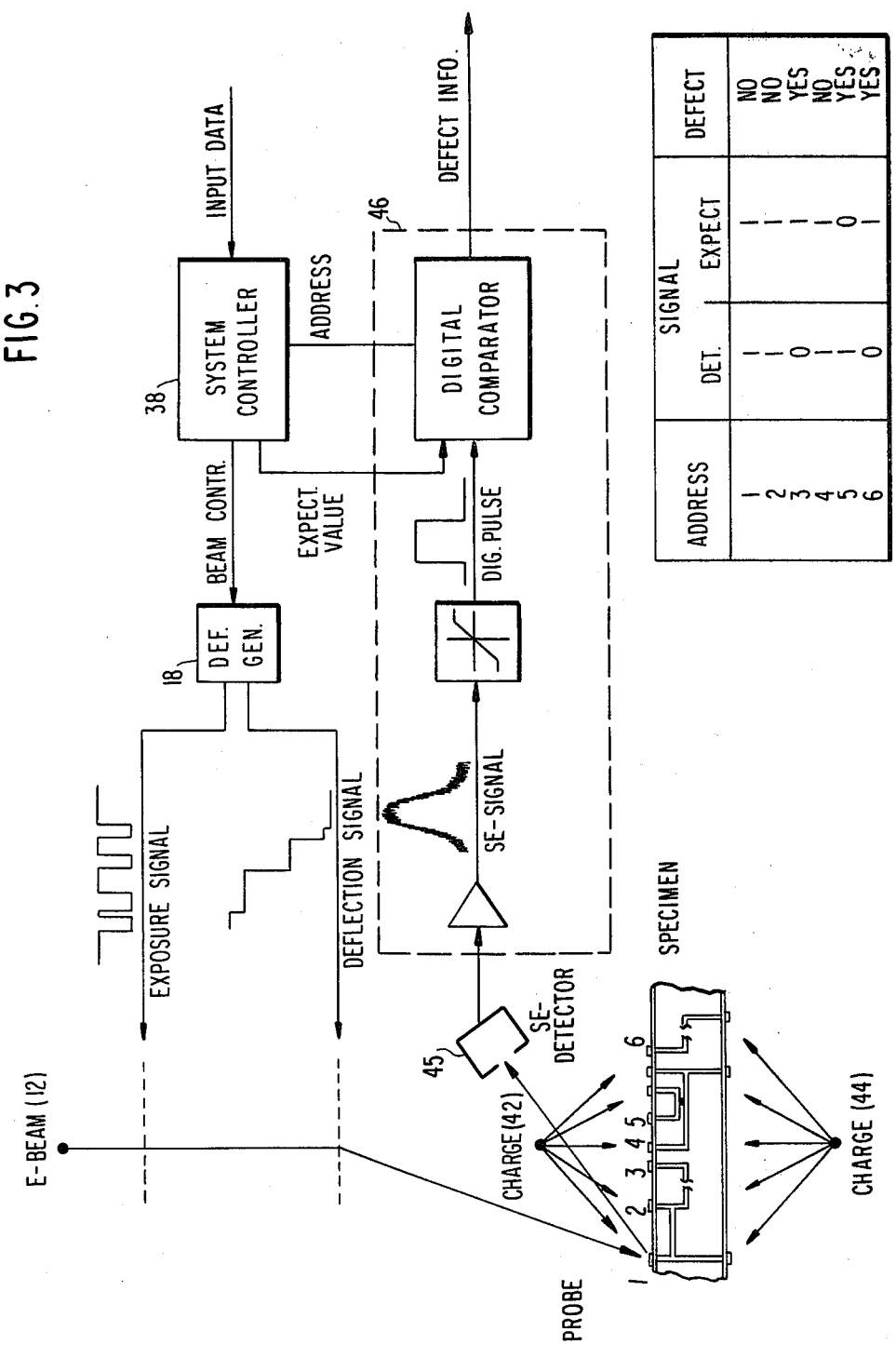

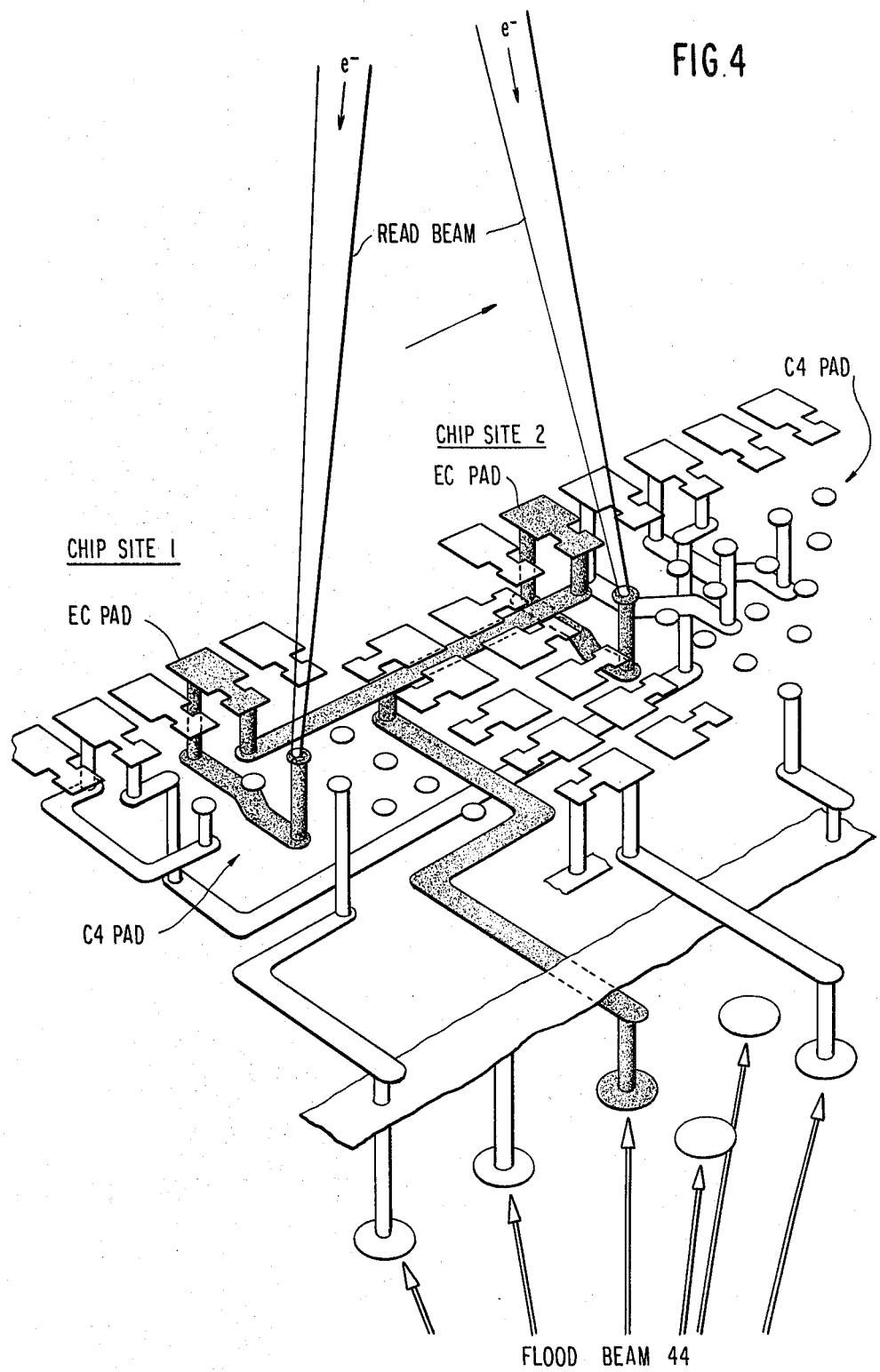

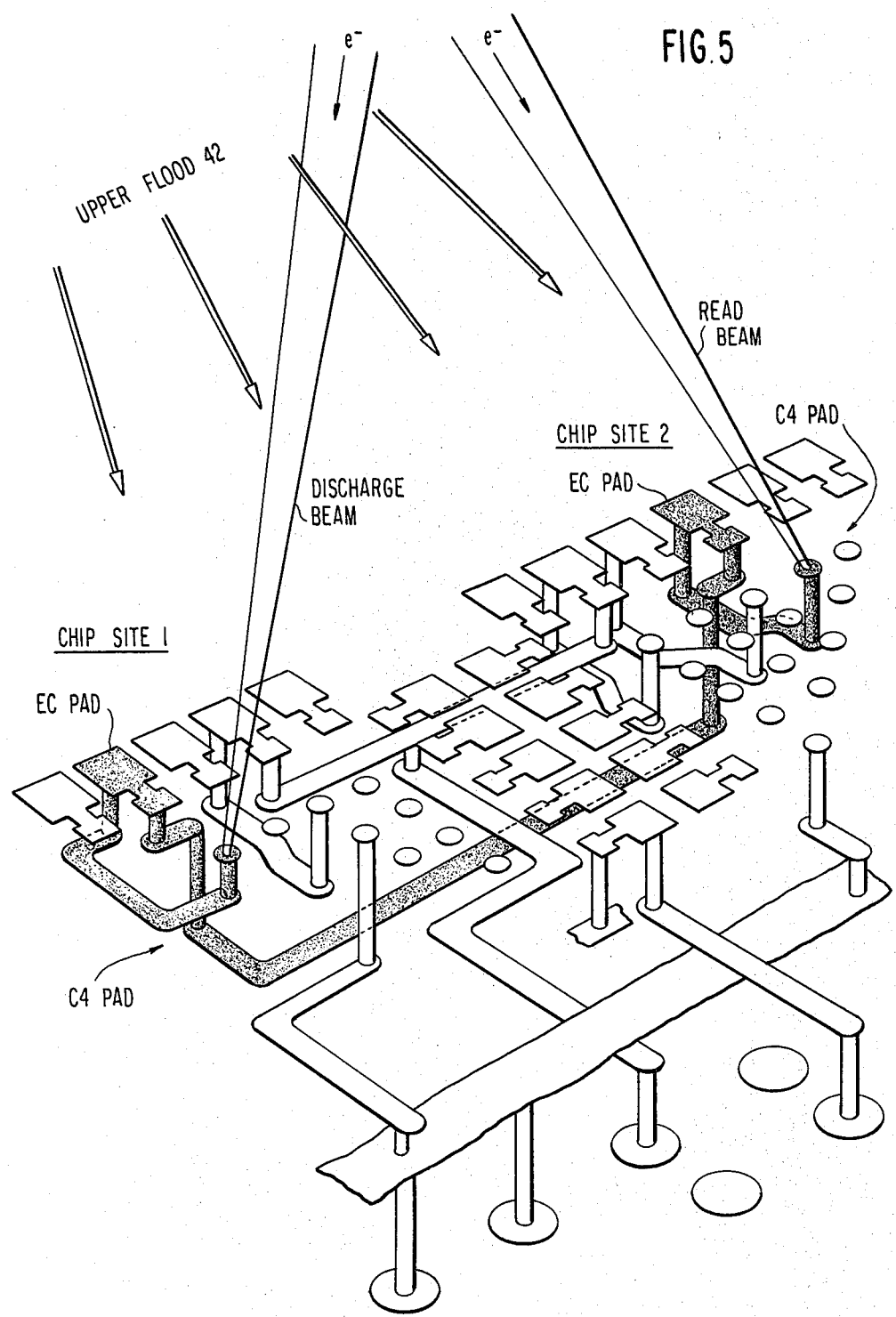

SYSTEM FOR CONTACTLESS ELECTRICAL PROPERTY TESTING OF MULTI-LAYER CERAMICS

BACKGROUND OF THE INVENTION

1. Field of the Invention

This invention relates to testing of multi-layer ceramic VLSI chip packaging substrates to determine electrical properties. In particular, this invention relates to a contactless method of electrically testing laminated components.

2. Prior Art

FIG. 1 shows a portion of a multi-layer ceramic (MLC) packaging substrate. Each of the layers making up the substrate begins as a flexible unfired sheet (greensheet) of soft ceramic material. Holes (vias) are punched in the greensheets in known patterns. An electrically conductive paste is then screened through a metal mask to form personalized wiring patterns on the greensheet and to fill its via holes. The completed substrate is fabricated by stacking multiple greensheet layers that are pressed together to form a semi-hard stack or laminate, which is fired. The result is a high performance substrate for VLSI chips, with improved reliability and reduced manufacturing cost.

Many VLSI chips are mounted on top of the substrate which establishes all electrical connections to and between chips. On the top surface of the substrate, each chip site is composed of a central array of chip connect vias (C4 pads or microsockets) surrounded by one or more frames of engineering change (EC) pads. The EC pads allow correction of wiring defects by the deletion of internal wiring and its replacement with discrete surface wires.

The substrate is composed of three main regions of layers: signal redistribution, signal distribution (personalization) and power distribution. The top several layers of the substrate redistribute the signal lines from the central array of chip connect vias, first to the surrounding EC pads and then down to the signal distribution layers. The substrate's central signal distribution layers carry signals between chips and to and from input/output lines. They also provide reference signal levels to the chips. The bottom power layers distribute power and redistribute signals to the bottom surface pin pads.

The signal redistribution and power distribution layers contain fixed wiring patterns while the signal distribution layer wiring varies by substrate part number.

Individual greensheets are pressed together to form laminates. Defects can occur at this point in the manufacturing process such as opens in the via connections, opens in the horizontal line connections and shorts between lines. Following lamination, the stack of greensheets is fired in kilns to produce a multi-layer ceramic MLC substrate.

Given these processing steps, testing subsequent to firing, when the material is more easily handled, results in discarding defective modules after signficant costs have already been incurred. Testing prior to firing, while preferred on a cost basis, has been restricted to optical inspection due to the nature of the deficiencies in existing testing technology.

Given the complexity of the package, sublamination techniques have been proposed to significantly reduce the manufacturing capacity needed to produce a given number of MLC substrates. Sublamination comprises dividing a stack of greensheets needed to produce a complete substrate into several sub-stacks. Typical are power/voltage, personalization and, redistribution substacks. These sub-stacks, comprising in the order of several tens of layers in some cases, are fabricated, pressed to form sublaminates, and independently tested. A set of tested sublaminates is then pressed to form a completed unfired stack or laminate. Given these manufacturing steps, an electrical test capability to determine whether open or short circuit conditions exist in a variety of different connection paths is essential. This test capability should exist prior to firing the laminates so that defective sublaminates may be discarded prior to completing the laminate. It is crucial that the rate of tesing be commensurate with the rate of manufacture of the substrates so that "on-line" testing can take place.

Sublaminates in the unfired state are formed from materials that are soft and easily damaged. Accordingly, prior art testing techniques utilizing some form of mechanical contact cannot be readily employed with these substrates. Any contact to the soft sublaminate structure will easily introduce depressions into the microsockets which are required to be dent free. Additionally, some external level variations are acceptable if the vias are only partially filled with conductive paste. A partial filling of vias occurs randomly and results in the imposition of conflicting requirements if mechanical contacting is employed. Such techniques must be able to contact lines which are several mils high as well as over-filled, filled and partially filled vias, simultaneously. Proposed mechanical contacting techniques that handle height variations in the order of several mils have yet to be proven reliable. They have, however, demonstrated a high probability of creating defects when the mechanical contact is removed.

Testing using human operators is not compatible with current manufacturing rates. Computer controlled handling techniques, however, are well established. Computer control in some areas of testing is also known, but integration of the tasks is still largely experimental.

In order to avoid the difficulties of mechanical probe testing of the described specimens, testing in a non-contact mode has been suggested. The prior art is replete with electron beam techniques for electrical continuity testing of semiconductor devices. U.S. Pat. No. 3,373,353 relates to the testing of sheets of dielectric material and particularly to the achievement of local measurements of thickness for detecting thickness defects. A low energy scanning electron beam charges the surface to cathode potential in a manner compatible with photoconductive target charging in a vidicon camera tube. The current through the dielectric layer to its conductive backing is measured with an electronic potential applied to the conductive backing, thereby generating a potential difference across the dielectric.

U.S. Pat. Nos. 3,763,425 and 3,764,898 both relate to non-contact continuity testing of conductors utilizing electron beams. Both measure the resistance of conductors on or embedded in an insulating matrix. A pair of individually controlled electron beams are used which must simultaneously address both ends of the conductor under test. In both patents, special masks are employed, individually tailored to the configuration of conductors of the specimen under test. As shown, for example, in FIG. 3 of the 3 898 patent, the mask may be a complex structure that makes loading and unloading of specimens difficult, thereby inhibiting thruput in manufacturing lines. In both patents, the masks stabilize the potential on the specimen surface and act as collecting and measuring electrodes. In the case of the '425 patent, the masks are used to generate secondary electrons for excitation of the target. Optimization of the operating parameters of the system can be attained, but only with a throughput penalty resulting from interference in the changing of specimens due to the use of such masks. Other systems utilizing mask techniques include U.S. Pat. Nos. 3,678,384 and 4,164,658.

The prior art also includes a number of proposals to use electron beam techniques in diagnostic analysis of electronic circuits. U.S. Pat. No. 4,139,774 relates to an electron beam apparatus that eliminates specimen staining which is caused by contamination in vacuum pumps. The system is designed for specimen surface analysis and not electrical testing. U.S. Pat. No. 4,172,228 utilizes a scanning electron microscope (SEM) to irradiate selected areas of an integrated circuit until failure occurs. U.S. Pat. No. 4,169,244 relates specifically to electron probes for testing electronic networks. The system requires electrical stimulation of the unit under test by means of external electronics.

I.B.M. Technical Disclosure Bulletin, Vol. 12, No. 7, December, 1969 discloses in very general terms the use of two separately controlled but simultaneously active scanning electron beams. The system is therefore similar to that disclosed in U.S. Pat. Nos. 3,763,425 and 3,764,898. The beams are focused at two distinct points in the array and the potential which exists at one energizing point is measured by capturing scattered secondary electrons with a pickup and measuring device.

I.B.M. Technical Disclosure Bulletin, Vol. 23, No. 5, October 1980, discloses a system that generates a voltage contrast at test points of a specimen utilizing a scanning Auger microprobe (SAM) or a scanning electron microscope (SEM) by biasing the specimen. The testing of IC chips occurs where the biasing corresponds to binary zero and one logic levels. Although the system is contactless and utilizes a commercially available electron beam instrument, it is not suited for testing large area specimens having a dielectric matrix or when physical electrical connections to the specimen are not present. Another SEM technique for testing IC chips is disclosed in I.B.M. Technical Disclosure Bulletin, Vol. 23, No. 7A, December 1980. The system is not contactless, utilizing multiple connections to the chips on a module to drive them. The system is therefore not suitable for soft unfired multi-layer ceramic materials.

SUMMARY OF THE INVENTION

Given the deficiencies of the prior art, this invention relates to a system for contactless testing of MLC electrical characteristics, such as opens and shorts. It represents an extension of the two beam testing system described in a co-pending application entitled "System for Contactless Testing of Multi-Layer Ceramics" filed on the same day as this application. In addition to testing for an open or continuity in through connections, the present invention provides the capability for shorts testing. This invention defines a comprehensive test system allowing testing for connections between top and bottom surfaces of the specimen, connections between two or more different points on the same surface, connections within a chip site (intra-chip), and connections between two or more chip sites (inter-chip). The invention also allows for testing of fixed or repetitive contact patterns and wiring unique to a specific part number (personalization wiring).

Accordingly, it is an object of this invention to define a system for continuity, opens and shorts, testing utilizing multiple electron beams applicable to any MLC specimen from individual, unfired greensheets to final laminated and fired products.

It is a further object of this invention to define a system for testing connections either intra or interchip and connections between top and bottom surfaces of the specimen in a contactless manner.

Yet another object of this invention is to define a system for electrically testing top surface, bottom surface, redistribution, power distribution, and signal distribution greensheets as well as laminates and sublaminates at a thruput capacity commensurate with that of other processing steps in the formation of MLCs.

A further object of this invention is to define a system minimizing computer control complexity and testing time while providing maximum reliability and avoiding mechanical contact with the specimen under test.

A further object of this invention is to provide a test system detecting defects, to allow sorting of the defective specimens for off-line inspection, repair, or rejection, utilizing comprehensive contactless test procedures.

These and other objects of this invention are achieved in a system having preferably three electron beams, one focused probe beam used in conjunction with upper and lower flood gun beams. The three electron beams may have different energies. Alignment, necessary because of substrate dimensional instability, is accomplished utilizing a scan over suitable areas of the top surface of the specimen. Such scanning generates secondary electron emissions which are detected and processed. Display may occur in real time on a monitor, or registration may be accomplished under computer control. Once registration is obtained, substantive testing begins immediately. Although chip sites are known with high accuracy by design, shrinkage in the specimen particularly after firing may alter their location, so alignment is needed.

Testing of opens and shorts employs three procedures:

(1) Top-to-bottom connections test for opens is accomplished by switching the lower flood gun to continuously apply a negative charge to the bottom surface of the specimen and simultaneously all those and only those features of the top surface with a galvanic connection to the bottom surface. When the top surface is scanned by the probe or "read" beam, the potential resulting from the charge of those features generates a strong secondary electron emission signal, which subsequently is processed (e.g., filtered, digitized) and stored in the memory of the computer. The computer also controls the system operation and beam deflection, at addresses corresponding to the location of those features on the specimen.

(2) Top-to-bottom connections test for shorts is accomplished by switching the lower flood gun to apply a pulse charge to the bottom surface in a manner commensurate with that for the opens test and is then terminated. Subsequently, the "read" beam is deflected in steps, in a given sequence to all features identified to be properly connected to the bottom in the preceding open tests. Scanning these features with the "read" beam causes generation of a strong secondary electron signal, but also discharges the feature. If a feature subsequently reached by the beam appears to be without charge, it must have been discharged through a short to any of the other features previously discharged. This other feature in the shorted pair can be identified, if the entire test process is repeated with a reversed stepping sequence.

(3) Top-to-top connections test for opens and shorts is accomplished by applying a negative charge to the top surface with the upper flood gun, which is pulsed and terminated before the "read" beam scan is started. The beam is stepped only to the surface end points of respective wiring networks. When the beam scans the first end point of a particular network, it discharges the entire network, if there is no break in the connections; but only part of it, if there is an open. An open is detected when the beam reaches a subsequent end point of the network in question and a strong secondary electron signal is detected. Shorts are detected in a manner described for top to bottom testing.

Testing for open circuit conditions in redistribution sublaminates is accomplished in a manner described in the copending application by switching the lower flood gun to shift the potential of the bottom surface of the specimen and simultaneously all those and only those features of the top surface with a galvanic connection to the bottom surface. When the area is scanned by the probe or "read" beam, the negative potential of those features generates a strong secondary electron emission signal producing bright images on a monitor or a signature of dark areas indicating an open.

Testing for a shorts condition is done by pulsing the lower flood gun to charge all connections in a manner commensurate with that for testing an open circuit. Subsequently, read beam scanning occurs at a preselected set of top surface microsockets utilizing the probe beam. This is done to neutralize the charge of those microsockets. Following this discharge scan, the entire microsocket array under consideration is scanned by the probe to reveal additional discharged microsockets to indicate any short circuit conditions between those and the preselected microsockets. The procedure is repeated for other preselected sets of microsockets to detect shorts of each against all others. The addresses of any shorted site would be noted so that off-line determinations on repair can be made.

The invention perceives the use of computer storage of values expected from a "perfect" sample that are compared with data received as testing occurs. Hence, unexpected test outputs also provide the address of any defective feature. The computer also controls beam operation as well as specimen handling.

This invention will be described with reference to the accompanying drawing and a description of the preferred embodiment that follows.

BRIEF DESCRIPTION OF THE DRAWINGS

FIG. 3 is a block diagram showing the principle of defect detection, and;

FIGS. 4–5 are schematic cutaway perspectives of a specimen showing networks under test.

DESCRIPTION OF THE PREFERRED EMBODIMENT

Figure 2:
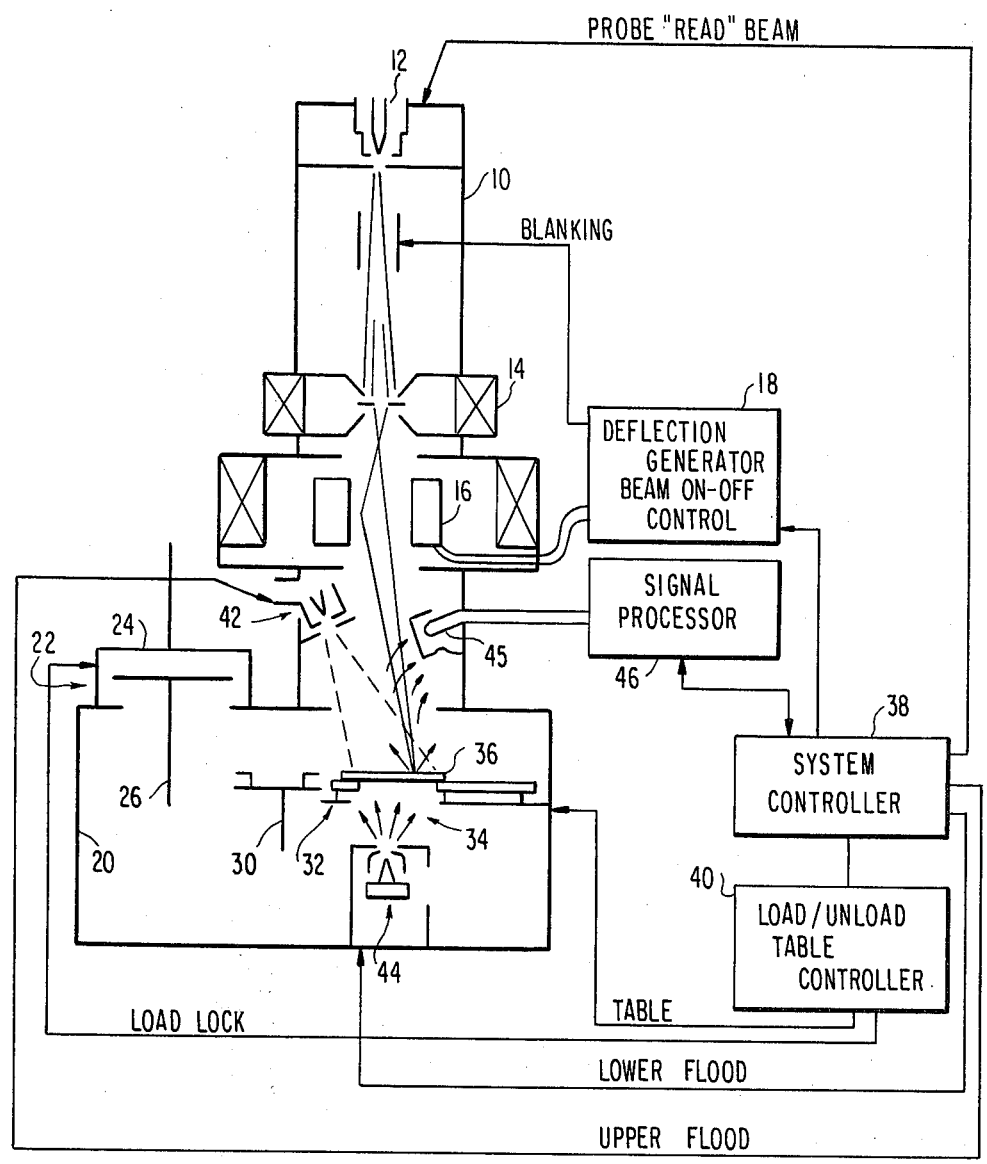
FIG. 2 is a schematic view showing the architecture of the test system in accordance with this invention.

Referring now to FIG. 2, the architecture of a preferred embodiment of a basic system of this invention is shown. An electron beam vacuum column 10 has an electron beam probe gun 12 disposed at one end thereof. A focusing lens system 14 comprising annular coils is used to focus the beam emanating from probe gun 12. Deflection coils 16, driven by a deflection generator 18, are used for beam steering. The electron optics are similar to those of scanning electron microscope systems, well known in the technology.

A processing vacuum chamber 20 has a load lock 22 with a lock port 24 to automatically handle specimens for test. A loading mechanism 26 is used to receive specimens that are mounted on carriers at load lock 22 and move them to transfer table 30. By means of mechanical pushers, air techniques and the like, specimens are moved from the transfer table 30 onto the specimen table 32. The table 32 is selectively movable in the X-Y direction perpendicular to the axis of beam 12 to position predetermined portions of the specimen within the beam deflection field. The table 32 has a port 34 large enough to expose the bottom side of specimen 36. The specimens, once testing is complete, are then transferred in a reverse manner back to the load lock such that when lock port 24 is raised, those specimens previously tested are removed from the chamber 20 and new specimens to be tested are introduced. Loading, unloading and table movement is controlled by system controller 38 providing instructions to the specimen handling controller 40. Electronic control of transfer movement and port access in a manner coordinated with the overall test procedure is well known in this technology. Such techniques are also well known in semiconductor lithography. The specific aspects of system controller 38 and load/unload/table controller 40 form no part of the present invention.

The present invention departs from the co-pending application by utilizing a pair of flood guns, upper flood gun 42 and lower flood gun 44. Guns 42 and 44 are selectively actuated in a manner to be described herein to charge the respective top and bottom surfaces of the specimen 36 during various test procedures. As will be described herein, other beam arrangements may be employed.

Disposed within column 10 is a secondary electron detector 45. Secondary electron emission is a result of scanning by the probe or "read" beam from gun 12 and is detected by detector 45 providing an output signal to processor 46. The output signal, converted to digital form, is provided to the system controller 38 for purposes of defect detection, and can be displayed and/or stored on a real time monitor (not shown).

Referring now to FIG. 3, operation of the system shown in FIG. 2 is illustrated. The specimen shown for testing has six address locations of interest on the top surface. Some, such as end points 1, 4 and 6 have wiring patterns running from the top surface through to the bottom surface. Others such as end points 2, 3 and 5 have only top-to-top connections.

Input data is supplied to the system controller 38 providing the addresses of the specimen points to the tested and the expected outputs if electrical continuity is present. The controller 38 provides signals to the deflection generator and beam on-off control to control the exposure (on-off) and the deflection (beam steering) of the probe or "read" beam. As shown in FIG. 2, the system controller 38 determines which of the flood guns 42 or 44 will be actuated and in the proper sequence with the E-beam. Such controller functions are well known in the litography art.

In a manner to be fully described herein, either flood gun 42 or 44 is activated to charge one surface of the specimen and then it may or may not be turned off. The "read" beam is then stepped across the specimen to the addresses supplied by the controller. The "read" beam causes the generation of secondary electrons from the surface of the specimen which are sensed by the secondary electron detector 45. The output is amplified, digitized and compared in the signal processor 46.

Comparison of actual digital pulses with expected values takes place for each address scanned. The comparison provides the results shown in the table in FIG. 3 for the specimen shown under top-to-bottom test. Point 1 continuity with the bottom surface is intact, hence no defect. Top-to-top continuity with point 2 also exists. However, an open exists between top-to-top points 2 and 3, hence, the detected signal expected at point 3 is not present given the open circuit. Also, an open is detected at point 6 since, as shown, no top-to-bottom continuity is present. Finally, FIG. 3 shows a short between points 4 and 5 that is detected when point 5 is scanned. Hence, the expected "O" is not present.

Figure 1:
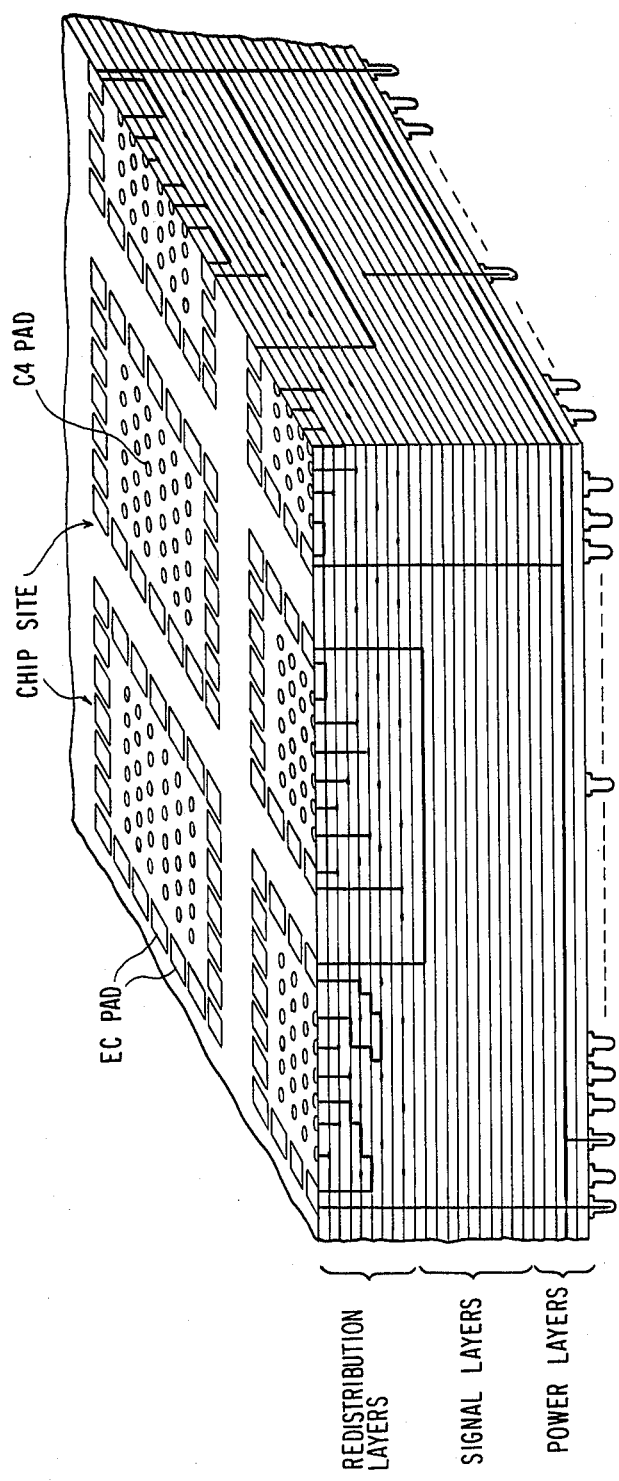
FIG. 1 is a schematic perspective of test specimen showing various layers.

Accordingly, as shown in FIGS. 1 and 3, typical greensheets, signal and power syblaminates, and laminates, contain wiring that can span the entire multi-chip region of the sample. Such samples can be scanned one chip area at a time, all at once, or with some other subdivision of the product area. The specific methodology for testing such complex structures, without contact, will now be described.

The specimen is loaded on the table 32 using handling devices 26 and 30 to effectuate transfer from the load lock 22 and is positioned for prealignment. Further alignment, if necessary, is accomplished with a low contrast secondary electron image received by detector 45.

The scope of testing on the specimen includes:
(1) connections between top and bottom surfaces of the specimen;
(2) connections between two or more different points on the same surface;
(3) connections within a chip site - intrachip connections.

These tests are performed on:
(1) fixed or repetitive contact patterns; and
(2) part number dependent wiring (personalization).

Referring to FIGS. 2, 3, and 4 testing for top to bottom open circuit conditions begins by switching on the lower flood gun 44 to charge the bottom surface of the specimen 36. A top-to-bottom open is shown in FIG. 3 as at point 6. FIG. 4 shows the most comprehensive case of a top-to-bottom wiring system and chip to chip wiring in the signal layer via the EC pads. As shown in the shaded portion a selected C4 pad is coupled to an EC pad in the redistribution layer of each chip site. Hence FIG. 4 portrays a wiring pattern having redistribution as well as personalization wiring. The broad electron beam from the lower flood gun is used to charge the bottom surface and simultaneously all and any of those features on the top surface with galvanic connection to the bottom surface. Accordingly, continuity in the wiring paths is defined, shown in FIG. 4 as the shaded area. The probe gun 12 is then actuated and by means of the deflection generator 18 acting under control of system controller 38 the top surface is scanned. The negative charge of those features scanned gives rise to the generation of strong secondary emissions, when there is continuity, that is detected by secondary electron emission detector 45. FIG. 4 shows the "read" beam stepped between C4 pads at two chip sites, testing for top-to-bottom continuity.

In accordance with the present invention, the energy level of the probe gun 12 is different from that of the flood gun 44. The flood beam preferably has an energy level equal or greater to the probe or read beam from gun 12. Detection of open circuit conditions is accomplished in a manner consistent with that disclosed in the copending application referenced herein.

The signal processor 46 is used to provide correlation with stored expected results for each test point. Accordingly, as shown in FIG. 3, values for each of the areas scanned are correlated with a predetermined stored signal so that as scanning is accomplished, a comparison is made to determine if an open circuit exists and, if so, its location. The defect location would be saved. In the case of the specimen shown in FIG. 3, point 6 would be noted.

Referring to FIGS. 2 and 4, testing for top to bottom shorts begins by pulsing the lower flood gun 44 to charge all connections in a manner compatible with testing for an open circuit condition. Then, the system controller 38 provides input signals to the deflection generator 18 to scan the top surface features with the probe beam 12. This scan, reads and neutralizes the charge at one point of those top surface nets that should be connected to the bottom.

Since continuity of those nets, shaded areas in FIG. 4 has been established in the previous open test, if a subsequently scanned net read out by the beam is already discharged, a short exists to one of those previously scanned nets. By reversing the sequence of the locations scanned, the other net of the shorted pair may be determined.

Referring now to FIGS. 2, 3 and 5, the top-to-top test for opens and shorts begins by pulsing the upper flood gun 42 to charge all nets, like the one shown in shading in FIG. 5, having at least an end point on the top surface. FIG. 3 shows net 2-3 as a top-to-top wiring network to be subjected to such a test. The pulsing of the upper flood gun is terminated before the "read" beam scan commences. The system controller 38 provides input signals to the deflection generator 18 to scan the top surface with the probe beam from gun 12. This beam is stepped to and only to the top surface end points of wiring networks. When the beam reads the charge at the first end point of a particular network, it discharges the entire network, if there is no break. It, however, discharges only a part of the network if there is an open. An open is detected, as in the case of FIG. 3, when the beam scans point 3, a subsequent point in the network, and "reads" the presence of a charge. Shorts are detected in a manner described for top-to-bottom testing.

Given this basic system architecture, it is apparent that a number of modifications can be accomplished without departing from the essential scope of the system. For example, a dual column system may be utilized wherein a second column identical to column 10 is placed below the specimen 36. The two beams could then be reversible in application, serving alternatively as flood or probe beams depending on the utilization. Beam focusing and dispersion would be accomplished using conventional focusing and deflection techniques. In cases of multiple network endings (i.e., voltage) on both top and bottom surfaces, the specimen may be flipped outside the vacuum chamber 20 and a second set of top-to-bottom and top-to-top testing can be performed. Alternatively, the two column structure may be employed to eliminate specimen flipping.

Another alternative is to use a four-beam system including two guns, modifying the FIG. 3 embodiment by placing a second column system, including flood gun, below the chamber 20. In such a system, each beam would have a fixed application.

In all these arrangements, although the column 10 is shown as having two focusing lenses, a single lens system may be used. Single yoke deflection 16 is satisfactory as long as the resolution requirements are met. Double deflection yokes may be employed for large field coverage. In any embodiment, the spot diameter would be 50 mm or less.

Various deflection scan patterns, through deflection generator 18, for probe gun 12 may also be accomplished. Although a predetermined step scan was described, the system may utilize various probe scan deflection modes, from bidirectional step raster to vector scan.

It is apparent, therefore, that given the system architecture as disclosed herein, detection of defects in specimens can be accomplished in an automated mode in a contactless manner. Those specimens with defects can then be sorted for off-line inspection, repair, or rejection as needed. Accordingly, specimen defect recognition and type identification can be made under computer control by system controller 38. The test procedure selection, field size selection, and pattern data retrieval and storage are also accomplished utilizing the system controller 38. The controller also functions for beam control, exposure control of all beams, and deflection control through instructions for deflection generator 18. Defect detection is accomplished by comparison of measured and expected signals by the signal processor 46.

The system controller 38 also functions to control the vacuum/load/unload/table controller 40 providing control for the entire system. Sample selection and loading is accomplished so that input mechanics and logistics are monitored and actuated.

The system, operating under computer control, provides throughput capacity commensurate with that of other manufacturing steps. Electrical testing without contact for shorts and opens in fired substrates and unfired laminates, sublaminates and greensheets of all types can therefore be accomplished. It is apparent that other modifications of this system may be accomplished without departing from the essential scope of this invention.

We claim:

1. A method of testing electrical continuity of conductors where respective conductor ends are exposed at at least one surface of a specimen of insulating material having two surfaces, the method comprising the steps of:
   pulsed irradiating a surface of said specimen with electrons to control the charge or electrostatic potential at said one surface and charge all conductors so exposed; and
   scanning a portion of at least one of said surfaces with an electron beam to selectively detect and change the potential of a conductor and thereby and all other conductors having continuity with said conductor.

2. A method of testing for electrical continuity in conductors disposed in an insulating specimen, without electrical contact, comprising the steps of:
   irradiating a surface of said specimen to control the potential of conductors exposed on said surface and simultaneously all conductors on an opposite surface having galvanic connection to said surface; and
   scanning a portion of said opposite surface with an electron beam to detect and change the potential of a conductor having an end point exposed at said opposite surface thereof, wherein only those conductors having continuity with said conductor also change their potential.

3. A method as defined in claim 2 wherein the step of irradiating a surface comprises pulsed irradiation prior to the step of scanning.

4. A method as defined in claim 2 wherein the step of irradiating a surface comprises continued irradiation of said surface during scanning.

5. A method as defined in claim 2 further comprising the step of scanning one end point of one conductor on one chip site on said specimen to change the potential of all of the end points of said one conductor as well as those conductors having continuity therewith and scanning all other end points of said one conductor as well as other conductors at said chip site to determine whether said other end points of said one conductor and other conductors have changed their potential by said first scanning.

6. A method of testing for electrical shorts between conductors disposed in an insulating specimen, without electrical contact, comprising the steps of:
   pulsed irradiating a surface of said specimen to control the potential of said surface and simultaneously that of all conductors having ends exposed at said same surface; and
   scanning a portion of said surface with an electron beam to change the potential of a selected conductor having an exposed end, wherein the potential of all those conductors having continuity with said conductor is also changed.

7. A method as defined in claim 6 further comprising the step of scanning additional conductors to determine whether such additional conductors had their potential changed.

8. A method as defined in claims 1, 2 or 6 wherein the step of scanning occurs following the termination of irradiating a surface.

9. A method as claimed in claims 1, 2 or 6 wherein said potential change generates the emission change of secondary electrons at said scanned portion, said method further comprising the steps of sensing the emission change of such secondary electrons to provide an output signal and digitizing said output signal.

10. A method as claimed in claims 1, 2 or 6 further comprising the steps of placing said specimen on a table, moving said to table to a first test position, performing tests on said conductors, moving said table to a second test position, continue testing on said conductors, removing said specimen from said test table and placing a different specimen on said table position.

11. The method of claims 1, 2 or 6 wherein said specimen comprises a stack of unfired layers of insulative material.

12. The method of claims 1, 2 or 6 wherein said specimen comprises a substrate of fired insulative material layers.

13. A method as claimed in claims 1, 2 or 6 comprising the steps of generating an output signal indicative of the potential of the surface scanned and comparing the output signal with a predetermined signal.

14. A method as claimed in claimed 13 wherein said step of comparing determines whether continuity exists in a conductive path with end points on said one surface.

15. A method as claimed in claim 9 wherein said step of comparing determines whether continuity exists in a conductive path through said specimen.

16. A method as defined in claims 1, 2 or 6 wherein the step of scanning comprising stepping said electron beam from one predetermined address to another predetermined address, said predetermined addresses being conductor land locations on said surface.

17. A method as defined in claim 16 wherein said other end further comprising points as well as said other conductors are located on a second chip site.

18. Apparatus for contactless testing electrical properties in unfired as well as fired insulative structures comprising:
   a first electron beam generator for flooding one surface of said structure;
   a second electron beam generator for flooding an opposite surface of said structure;
   a scanning electron beam generator for irradiating selected portions of said one surface of said structure; and
   detector means for sensing the generation of secondary electrons emitted from said selected portions during irradiation by said scanning electron beam.

19. Apparatus for testing electrical properties in unfired as well as fired insulative structures without electrical contact comprising:
   a pair of flood electron beam generators for charging opposite surfaces of said structure;
   a scanning electron beam for irradiating selected portions of at least one surface of said structure; and
   means for detecting the emission of secondary electrons from those selected portions irradiated by said scanning beam.

20. The apparatus of claims 18 or 19 further comprising a test chamber, a test table disposed in said chamber, and transfer means to load and unload substrates to and from table.

21. The apparatus of claims 18 or 19 wherein said flood electron beam generators have different acceleration voltages.

22. Apparatus of claim 21 wherein the acceleration voltage for said scanning electron beam is different than that of either of said flood electron beam generators.

23. The apparatus of claims 18 or 19 further comprising signal processor means receiving the output of said detector means and converting an analog output to a digital output.

24. The apparatus of claim 23 further comprising, means for deflecting across the surface of said structure an electron beam generated by said scanning electron beam generator, said means for deflection of said electron beam receiving input data indicative of addresses of portions to be scanned controlling the deflection of said scanning electron beam to step said beam from one address to another.

25. The apparatus of claim 23 wherein said signal processor means includes comparator means, said means for deflection of said electron beam receiving input data indicative of expected output values of secondary electron emission signals for each address scanned and, said comparator compares the digital output with said expected output values and generates a signal indicative of whether a difference exists between expected and actual values.

26. The apparatus of claim 25 further comprising means to control said transfer means in accordance with a predetermined test routine.

27. The apparatus of claim 25 wherein said flood electron beam generators are disposed on either side of said test table and one of said flood electron beam generators positioned outside the deflection range of said scanning electrons beam generator.

28. The apparatus of claim 25 wherein said detector means is positioned to receive secondary electron emission from any portion of said structure but is outside the deflection range of said scanning electron beam generator.

* * * * *